(12) United States Patent
Ueno et al.

(10) Patent No.: US 8,309,980 B2
(45) Date of Patent: Nov. 13, 2012

(54) INFRARED LIGHT EMITTING DEVICE

(75) Inventors: Koichiro Ueno, Tokyo (JP); Naohiro Kuze, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 245 days.

(21) Appl. No.: 12/921,318

(22) PCT Filed: Mar. 13, 2009

(86) PCT No.: PCT/JP2009/054954
§ 371 (c)(1),
(2), (4) Date: Sep. 7, 2010

(87) PCT Pub. No.: WO2009/113685
PCT Pub. Date: Sep. 17, 2009

(65) Prior Publication Data
US 2011/0018010 A1    Jan. 27, 2011

(30) Foreign Application Priority Data
Mar. 14, 2008  (JP) .................................. 2008-066404

(51) Int. Cl.
H01L 33/14 (2010.01)
(52) U.S. Cl. .................................. 257/94; 257/E33.027
(58) Field of Classification Search .................... 257/94, 257/102, 103, E33.023, E33.027, E33.032
See application file for complete search history.

(56) References Cited

U.S. PATENT DOCUMENTS

| | | | |
|---|---|---|---|
| 4,918,496 A | 4/1990 | Matsushima et al. | |
| 5,331,656 A | 7/1994 | Tanaka | |
| 5,747,827 A | 5/1998 | Duggan et al. | |
| 6,078,602 A | 6/2000 | Sato | |
| 6,133,590 A | 10/2000 | Ashley et al. | |
| 6,455,879 B1 | 9/2002 | Ashley et al. | |

FOREIGN PATENT DOCUMENTS

| | | |
|---|---|---|
| JP | 62-291985 | 12/1987 |
| JP | 64 9668 | 1/1989 |
| JP | 1-264287 | 10/1989 |

(Continued)

OTHER PUBLICATIONS

Moiseev et al. "Mid-Infrared Lasers Operating on a Single Quantum Well at the Type II Heterointerface." 2001, IEEE, pp. 534-535.*

(Continued)

*Primary Examiner* — Wensing Kuo
(74) *Attorney, Agent, or Firm* — Morgan, Lewis & Bockius LLP

(57) ABSTRACT

Provided is an infrared light emitting device in which dark current and diffusion current caused by thermally excited holes are suppressed. Thermally excited carriers (holes) generated in a first n-type compound semiconductor layer (102) tend to diffuse in the direction of a π layer (105). But, the dark current by holes is reduced by providing an n-type wide band gap layer (103) with a larger band gap than the first layer (102) and the π layer (105) that suppresses the hole diffusion between the first layer (102) and the π layer (105). The wide band gap layer (103) has a band gap shifted relatively to valence band direction by n-type doping and thereby more effectively functions as a diffusion barrier for the thermally excited holes. Namely, the band gap and n-type doping of the wide band gap layer (103) are adjusted to suppress diffusion of the thermally excited carriers.

19 Claims, 16 Drawing Sheets

FOREIGN PATENT DOCUMENTS

| | | |
|---|---|---|
| JP | 6-53602 | 2/1994 |
| JP | 8-250810 | 9/1996 |
| JP | 10-163567 | 6/1998 |
| JP | 2000-501238 | 2/2000 |
| JP | 2001-284737 | 10/2001 |
| JP | 2004-031635 | 1/2004 |

OTHER PUBLICATIONS

Ashley, et al., "Uncooled InSb/in1-xAlxSb mid-infrared emitter", Appl. Phys. Lett., 64 (8), pp. 2433-2435, May 2, 1994.

* cited by examiner

INFRARED LIGHT EMITTING DEVICE

TECHNICAL FIELD

The present invention relates to an infrared light emitting device.

BACKGROUND ART

Generally, infrared light in a long wavelength range of 3 µm or more is used for human sensors for detecting the presence of a human body, noncontact temperature sensors, gas sensors and the like because of its thermal effect or infrared light absorption effect by gas. Among these application examples, particularly gas sensors have received attention in recent years because they are usable for monitoring and protecting air quality and also for early detection of fire and the like. The principles of the gas sensors using the infrared light are as follows. First, a gas to be measured is injected into a space between an infrared light source and a light receiving device. Since a particular gas absorbs infrared light having a specific wavelength, the type and concentration of the gas can be measured by analyzing wavelength spectrums before and after the injection of the gas. Here, an incandescent bulb is used as the infrared light source, but infrared light emitted from the incandescent bulb is white light. Thus, in order to disperse the light having a specific wavelength, a filter needs to be provided on the light receiving device side. Such a filter is expensive. In addition, the filter lowers the intensity of the infrared light, and consequently lowers the sensitivity of the gas sensor. Moreover, since the incandescent bulb has a short life, the light source needs to be replaced frequently.

To solve the problems described above, it is effective to use, as the light source, a semiconductor light emitting device (LED: Light Emitting Diode) which emits infrared light having a specific wavelength. Here, in order to produce such a light emitting device, a device which emits infrared light in a long wavelength range of 3 µm or more is required. However, the device with such a wavelength range is greatly affected by an ambient temperature, and has a trouble in use at room temperature. In general, in the light emitting device described above, a so-called pn junction diode structure is formed in a semiconductor having a band gap that allows emission of infrared light with a wavelength of 3 µm or more. The light emitting device emits infrared light by causing a forward current to flow through the pn junction diode, and then recombining electrons and holes in a depletion layer that is a junction portion.

However, the band gap of the semiconductor which allows emission of infrared light with a wavelength of 3 µm or more is as small as 0.41 eV or less. Such a semiconductor having a small band gap cannot obtain sufficient pn diode characteristics because thermally excited carriers increase an intrinsic carrier density at room temperature and thereby reduce a device resistance. This is because, when the intrinsic carrier density is high, a leak current of the device, such as a diffusion current and a dark current, is increased. For this reason, in such a light emitting device, a cooling mechanism such as a Peltier element is generally and conventionally used to suppress thermally excited carriers. However, there is a problem that such a cooling mechanism increases the size and price of the device.

To solve the above problem, research and development have been conducted on a light emitting device capable of emitting infrared light in a long wavelength range even at room temperature. For example, in a light emitting device described in Non-patent Document 1, a diode having a p-n-n structure with indium antimonide (InSb) is formed on a p-type InSb substrate, and an AlInSb barrier layer for suppressing diffusion of electrons is used between the p layer and the π layer to enable emission of infrared light with a wavelength of 5.5 µm or more at room temperature.

In terms of a conventional semiconductor material having a small band gap, emphasis is placed on suppressing a leak current (diffusion current or dark current) of electrons as described in Non-patent Document 1, because electron mobility is generally much higher than hole mobility. However, in the light emitting device which recombines electrons and holes, suppression of dark current and diffusion current of holes in addition to electrons is required to further improve device characteristics.

The present invention has been made in consideration of the foregoing problems. It is an object of the present invention to provide an infrared light emitting device capable of suppressing diffusion current and dark current of thermally excited holes at room temperature.

Non-patent Document 1: T. Ashley et al., "Uncooled InSb/In1-XAlXSb mid-infrared emitter," Applied Physics Letters, 64(18), 2 May 1994, pp. 2433-2435

DISCLOSURE OF THE INVENTION

To provide the infrared light emitting device described above, a first aspect of the present invention provides an infrared light emitting device comprising: a semiconductor substrate; a first n-type compound semiconductor layer on the semiconductor substrate; an n-type wide band gap layer on the first n-type compound semiconductor layer; and a p-type doped π layer on the n-type wide band gap layer, wherein each of the layers other than the n-type wide band gap layer has a band gap of 0.41 eV or less, and wherein the n-type wide band gap layer has a larger band gap than the first n-type compound semiconductor layer and the π layer.

In addition, a second aspect of the invention provides the infrared light emitting device according to the first aspect, wherein the π layer is disposed directly on the n-type wide band gap layer.

Moreover, a third aspect of the invention provides the infrared light emitting device according to the first aspect, further comprising a second n-type compound semiconductor layer between the n-type wide band gap layer and the π layer, the second n-type compound semiconductor layer having the same composition as the first n-type compound semiconductor layer.

Further, a fourth aspect of the invention provides the infrared light emitting device according to any of the first to third aspects, wherein the π layer has the same composition as the first n-type compound semiconductor layer, and the n-type wide band gap layer has a film thickness of a critical film thickness or less.

Further, a fifth aspect of the invention provides an infrared light emitting device comprising: a semiconductor substrate; a first n-type compound semiconductor layer on the semiconductor substrate; an n-type wide band gap layer on the first n-type compound semiconductor layer, the n-type wide band gap layer having a film thickness of a critical film thickness or less; a second n-type compound semiconductor layer on the n-type wide band gap layer, the second n-type compound semiconductor layer having the same composition as the first n-type compound semiconductor layer at an interface with the n-type wide band gap layer, and having a gradient composition in the film thickness direction; and a p-type doped π layer on the second n-type compound semiconductor layer, the π layer having the same composition as the second n-type compound semiconductor layer at an interface with the second n-type compound semiconductor layer, wherein each of the layers other than the n-type wide band gap layer has a band gap of 0.41 eV or less, and the n-type wide band gap layer has a larger band gap than the first n-type compound semiconductor layer and the n layer.

Further, a sixth aspect of the invention provides an infrared light emitting device comprising: a semiconductor substrate; a first n-type compound semiconductor layer on the semiconductor substrate; an n-type wide band gap layer on the first n-type compound semiconductor layer, the n-type wide band gap layer having a film thickness of a critical film thickness or less; a p-type doped composition transition layer on the n-type wide band gap layer, the p-type doped composition transition layer having the same composition as the first n-type compound semiconductor layer at an interface with the n-type wide band gap layer, and having a gradient composition in the film thickness direction; and a p-type doped π layer on the composition transition layer, the π layer having the same composition as the composition transition layer at an interface with the composition transition layer, wherein each of the layers other than the n-type wide band gap layer has a band gap of 0.41 eV or less, and the n-type wide band gap layer has a larger band gap than the first n-type compound semiconductor layer and the π layer.

Further, a seventh aspect of the invention provides the infrared light emitting device according to any of the fourth to sixth aspects, further comprising: at least one first repeated layer and at least one second repeated layer between the first n-type compound semiconductor layer and the n-type wide band gap layer, the first repeated layer having the same composition as the first n-type compound semiconductor layer, the second repeated layer having the same composition as the n-type wide band gap layer, wherein the first and second repeated layers are alternately disposed, and a film thickness of the second repeated layer is a critical film thickness or less.

Further, an eighth aspect of the invention provides the infrared light emitting device according to any of the first to seventh aspects, wherein each of the first n-type compound semiconductor layer and the π layer is made of InAs, InSb, InAsSb or InSbN, and the n-type wide band gap layer is made of AlInSb, GaInSb or AlAs, GaAs, AlSb, GaSb, or a mixed crystal of those compounds.

Further, a ninth aspect of the invention provides the infrared light emitting device according to any of the first to eighth aspects, wherein the n-type wide band gap layer is doped at the same concentration as the first n-type compound semiconductor layer.

Further, a tenth aspect of the invention provides the infrared light emitting device according to any of the first to ninth aspects, further comprising a p-type compound semiconductor layer disposed on the π layer, the p-type compound semiconductor layer being p-type doped at a higher concentration than the π layer, and having the same composition as the first n-type compound semiconductor layer or the π layer.

Further, an eleventh aspect of the invention provides the infrared light emitting device according to any of the first to ninth aspects, further comprising a p-type wide band gap layer disposed directly on the π layer, the p-type wide band gap layer being p-type doped at a higher concentration than the π layer, and having a larger band gap than the first n-type compound semiconductor layer and the π layer.

Further, a twelfth aspect of the invention provides the infrared light emitting device according to the eleventh aspect, wherein each of the first n-type compound semiconductor layer and the π layer is made of InAs, InSb, InAsSb or InSbN, and wherein each of the n-type wide band gap layer and the p-type wide band gap layer is made of AlInSb, GaInSb or AlAs, GaAs, AlSb, GaSb, or a mixed crystal of those compounds.

Further, a thirteenth aspect of the invention provides the infrared light emitting device according to the eleventh or twelfth aspects, wherein the p-type wide band gap layer has a film thickness of a critical film thickness or less, the device further comprising a p-type compound semiconductor protection layer on the p-type wide band gap layer, the p-type compound semiconductor protection layer being doped at least at the same concentration as the p-type wide band gap layer.

Further, a fourteenth aspect of the invention provides the infrared light emitting device according to the thirteenth aspect, wherein the p-type doped compound semiconductor protection layer has the same composition as the first n-type compound semiconductor layer or the π layer.

Further, a fifteenth aspect of the invention provides the infrared light emitting device according to any of the first to fourteenth aspects, wherein the film thickness of the first n-type compound semiconductor layer exceeds 0.1 μm.

Further, a sixteenth aspect of the invention provides the infrared light emitting device according to any of the first to fifteenth aspects, wherein the semiconductor substrate is a semi-insulating semiconductor substrate, or a semiconductor substrate wherein the semiconductor substrate and the first n-type compound semiconductor layer formed on the semiconductor substrate are electrically isolable, the device further comprising: a first electrode formed, in a region where the n layer is not formed, on the first n-type compound semiconductor layer; and a second electrode formed on the π layer.

Further, a seventeenth aspect of the invention provides the infrared light emitting device according to the sixteenth aspect, wherein, on the semiconductor substrate, a plurality of infrared light emitting devices are sequentially formed so that the first electrode formed in any of the infrared light emitting devices and a second electrode formed in another infrared light emitting device adjacent to the infrared light emitting device having the first electrode formed therein are connected to each other in series.

The present invention can provide an infrared light emitting device with high diode resistance, the device including an n-type compound semiconductor layer and a p-type doped π layer. In the device, an n-type wide band gap layer having a larger band gap than the n-type compound semiconductor layer and the π layer is provided between the n-type compound semiconductor layer and the π layer. This n-type wide band gap layer prevents holes generated in the n-type compound semiconductor layer by thermal excitation at room temperature from diffusing toward the π layer to reduce a dark current in the pn diode due to the holes and to prevent holes generated on the π layer side by thermal excitation from diffusing toward the n-type compound semiconductor layer, thereby reducing a diffusion current in the pn diode.

BEST MODE FOR CARRYING OUT THE INVENTION

With reference to the drawings, embodiments of the present invention will be described in detail below.

Embodiment 1

Figure 1:
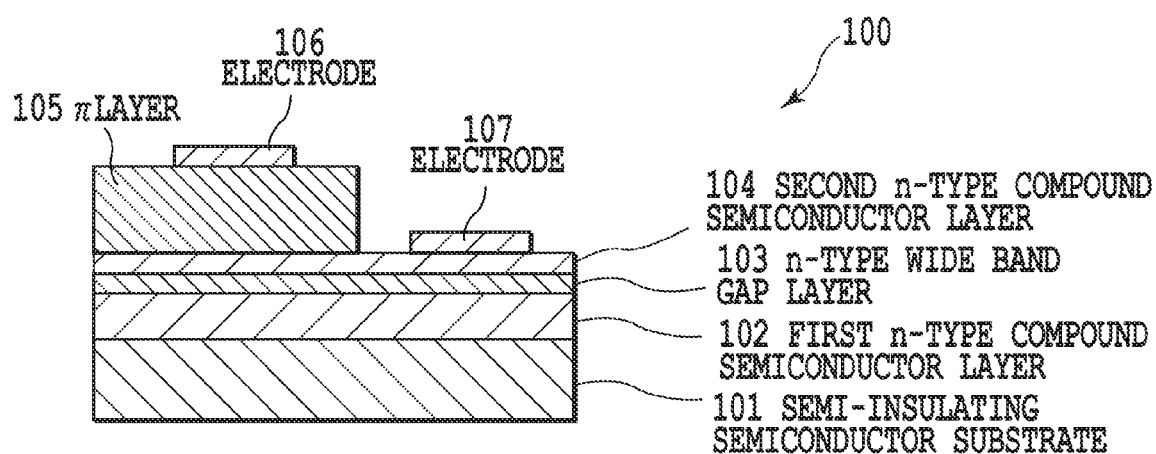
FIG. 1 is a schematic diagram of an infrared light emitting device according to embodiment 1.

FIG. 1 is a schematic diagram of an infrared light emitting device according to embodiment 1. An infrared light emitting device 100 includes a semi-insulating semiconductor substrate 101; a first n-type compound semiconductor layer 102 on the semiconductor substrate 101; an n-type wide band gap layer 103 on the first n-type compound semiconductor layer 102; a second n-type compound semiconductor layer 104 on the n-type wide band gap layer 103, the second n-type compound semiconductor layer 104 having the same composition as the first n-type compound semiconductor layer 102; a p-type doped π layer 105 on the second n-type compound semiconductor layer 104; an electrode 106 on the π layer 105; and an electrode 107 on the second n-type compound semiconductor layer 104.

The infrared light emitting device 100 is a so-called PN junction diode, where a depletion layer is formed between the second n-type compound semiconductor layer 104 and the π layer 105. The infrared light emitting device 100 generates infrared light by causing a forward current to flow through a PN junction and thereby recombining carriers.

Figure 2:
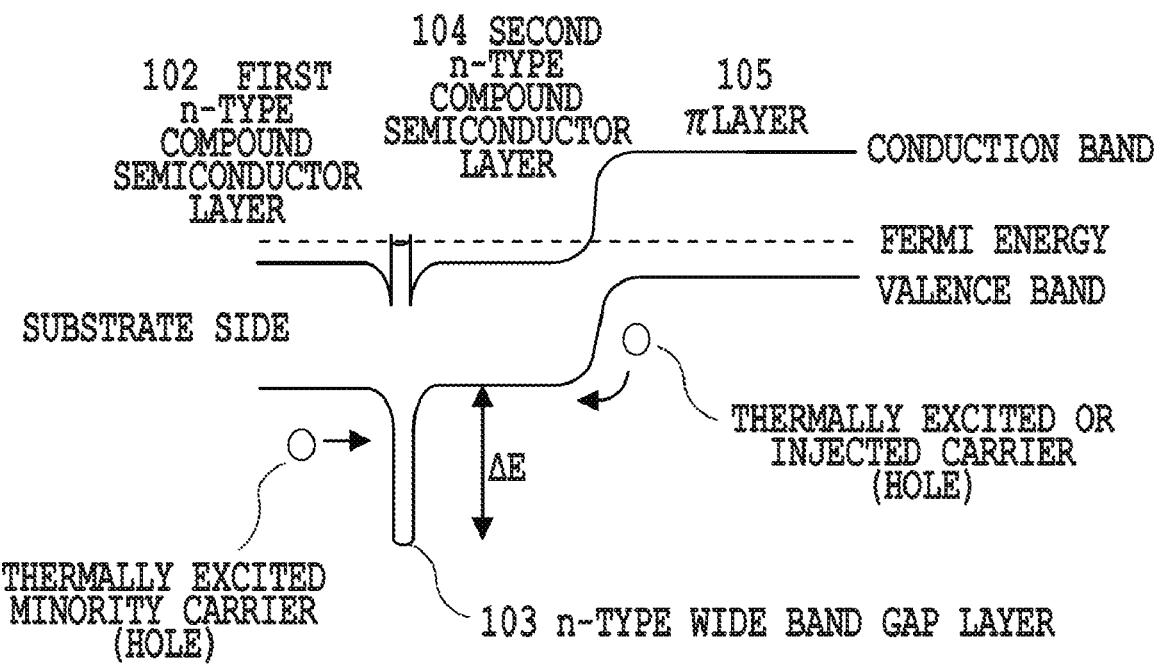
FIG. 2 is a band diagram of the infrared light emitting device according to embodiment 1.

In the infrared light emitting device 100 according to the present embodiment, the n-type wide band gap layer 103 has a larger band gap than the first n-type compound semiconductor layer 102 and the π layer 105. This suppresses the diffusion of holes toward the π layer which were generated in the n-type compound semiconductor layer by thermal excitation at room temperature, in other words, suppresses the dark current of the diode. Here, FIG. 2 shows such a situation. Holes which are minority carriers generated in the first n-type compound semiconductor layer 102 tend to diffuse toward the π layer 105. But, the n-type wide band gap layer 103 has a larger band gap than the first n-type compound semiconductor layer 102 and the n layer 105 to suppress the diffusion of the holes. By providing the n-type wide band gap layer 103 between the first n-type compound semiconductor layer 102 and the π layer 105, the dark current is reduced. The n-type wide band gap layer 103 has a band gap shifted relatively to valence band direction by n-type doping, and thereby effectively functions as a diffusion barrier for the holes. In other words, the band gap and n-type doping of the n-type wide band gap layer 103 are adjusted to suppress the diffusion of the holes.

While holes generated by thermal excitation in the π layer 105 normally move toward the π layer 105 due to an internal electric field formed by the pn junction, some of them move toward the n-type compound semiconductor layer 102 through diffusion to form a diffusion current of the diode. As described above, in a semiconductor which has a small band gap and can absorb infrared light having a wavelength of 3 μm or more, an intrinsic carrier density is increased by thermal excitation even at room temperature. Here, the diffusion current is proportional to the square of the intrinsic carrier density. In other words, the larger the intrinsic carrier density is, the larger the diffusion current becomes. Since a large diffusion current reduces the diode resistance of the device, it is particularly important to suppress the intrinsic carrier density.

The n-type wide band gap layer 103 also serves as a barrier for the diffusion current of holes as shown in FIG. 2. Therefore, it can suppress the diffusion current. This makes no sense if the compound semiconductor layer is formed of a compound semiconductor, such as gallium nitride (GaN) or gallium arsenide (GaAs), which originally has a band gap so large that the influence of thermally excited carriers is ignorable and originally has a small diffusion current. The suppression of the diffusion current is an effect that is obtained because the compound semiconductor layer is formed of a semiconductor having a small band gap as described above.

Furthermore, when the infrared light emitting device 100 is used as a light emitting device as shown in FIG. 2, holes injected from the π layer 105 side can be prevented from diffusing into the n-type compound semiconductor layer 102. Thus, efficiency of recombination of electrons and holes can also be improved in the depletion layer formed by the pn junction.

In order to suppress the dark current and diffusion current due to diffusion of the thermally excited holes described above, the magnitude of a required energy difference ΔE between the n-type wide band gap layer 103 and the valence band needs to be larger than the energy of the holes. Here, one example of the energy imparted to the holes is a thermal energy, which is about 25 meV at room temperature. Therefore, the magnitude of ΔE in this case is preferably at least the thermal energy, i.e., 25 meV at room temperature.

Furthermore, in the case of the light emitting device, in order to prevent holes injected by forward bias applied to the diode from diffusing into the n-type compound semiconductor layer 102, ΔE is preferably larger than at least a potential difference of the PN junction. The potential difference of the PN junction is generally smaller than the band gap to prevent a tunnel leak current. Accordingly, ΔE is preferably at least 50% of, more preferably 80% of, and still more preferably equal to or larger than the energy band gap of the first and second n-type compound semiconductor layers 102 and 104 as well as the n layer 105. For example, when InSb is used for the first and second n-type compound semiconductor layers 102 and 104 as well as the π layer 105, ΔE is preferably 0.09 eV or more, more preferably 0.14 eV or more, still more preferably 0.18 eV or more at room temperature. A suitable magnitude of the band gap of the n-type wide band gap layer 103 to obtain ΔE as described above is preferably 1.5 times or more, more preferably twice or more, and still more preferably 2.3 times or more larger than the size of the energy band gap of the first and second n-type compound semiconductor layers 102 and 104 as well as the π layer 105. However, the magnitude of ΔE described above is adjustable by the electron affinity of materials or the doping concentration in the n-type wide band gap layer, besides the band gap of the n-type wide band gap layer 103.

Next, the respective constituent elements of the infrared light emitting device 100 according to this embodiment will be described in detail.

First, the compound semiconductor forming each of the layers other than the n-type wide band gap layer 103 has a narrow band. In particular, the compound semiconductor is preferably a compound semiconductor having a band gap of 0.41 eV or less and being capable of absorbing and generating infrared light in a long wavelength range of 3 μm or more. Since the device is envisioned to be used at room temperature, it is preferable that the band gap be 0.41 eV or less at room temperature. However, when the operating temperature of the device is not room temperature, the band gap only needs to be 0.41 eV or less at the operating temperature. Moreover, the band gap is preferably 0.36 eV or less that enables emission of infrared light having a wavelength of 3.6 μm or more, and is more preferably 0.25 eV or less that enables emission of infrared light having a wavelength of 5 μm or more. This is because the smaller the band gaps of the compound semiconductors that respectively form the layers other than the n-type wide band gap layer 103, the larger the effect of the n-type wide band gap layer 103 to suppress the dark current and diffusion current as described above.

As the compound semiconductor having a narrow energy band gap of 0.41 eV or less at room temperature, any of InAs, InSb, InAsSb and InSbN can be used. InAs and InSb have energy band gaps of 0.36 eV and 0.18 eV, respectively, at room temperature. An energy band gap $E_g$ of an $InAs_xSb_{1-x}$ mixed crystal (0<x<1) is expressed by $0.58x^2-0.41x+0.18=E_g$, which has a very large nonlinear factor. Therefore, the energy band gap of InAsSb at room temperature is 0.36 eV or less, which is lower than the energy band gap of InAs at room temperature. Moreover, a band gap of an $InSb_{1-y}N_y$ mixed crystal (0<y<0.01) has a much larger nonlinear factor. It is known that the band gap approaches approximately 0 when the composition y of nitrogen N is only 0.01.

In addition, the n-type wide band gap layer 103 includes AlInSb, GaInSb or AlAs, GaAs, AlSb, GaSb, or a mixed crystal thereof. An energy band gap of each n-type wide band gap layer at room temperature is determined by a composition ratio. For example, an $Al_{0.17}In_{0.83}Sb$ layer has a band gap of 0.46 eV at room temperature. The above materials are preferable because they can produce a stable compound or mixed crystal semiconductor compared with materials, such as HgCdTe (MCT), which are difficult to be compositionally-controlled or reproduced during crystal growth due to high vapor pressure of Hg.

Figure 3:
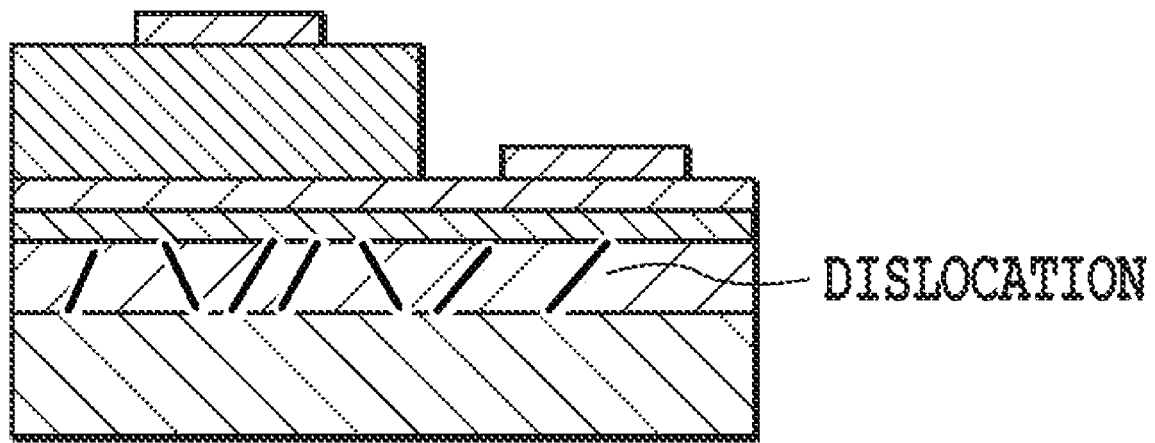
FIG. 3 is a diagram showing dislocations in a first n-type compound semiconductor layer.

In order to further improve the device characteristics of the infrared light emitting device 100 according to this embodiment, the π layer 105 can be made to have the same composition as the first n-type compound semiconductor layer 102, and the film thickness of the n-type wide band gap layer 103 can be made to be a critical film thickness or less. A case where the film thickness of the n-type wide band gap layer 103 is the critical film thickness or less is described below. The n-type wide band gap layer 103 of the infrared light emitting device 100 has a larger band gap than that of the first n-type compound semiconductor layer 102, and is different in composition from the first n-type compound semiconductor layer 102. It is found from experiments that when such a layer is formed on the first n-type compound semiconductor layer 102, misfit dislocations formed at the interface between the semiconductor substrate 101 and the first n-type compound semiconductor layer 102 are changed in the propagation direction at the interface between the n-type wide band gap layer 103 and the first n-type compound semiconductor layer 102 in a direction parallel to that interface as shown in FIG. 3. The dislocations changed in the propagation direction annihilate each other or form a dislocation loop and return again to the interface with the semiconductor substrate 101. In other words, the dislocations can be trapped in the first n-type compound semiconductor layer 102. Examples will be described later. Thus, propagation of dislocations to the PN junction can be significantly reduced, and the influences of crystal defects on the device characteristics of the infrared light emitting device 100 can be reduced. The crystal defects in the compound semiconductor layer may serve as a carrier leak path and deteriorate diode characteristics, or may serve as a recombination center and deteriorate emission characteristics. Note that, as described above, the effect of the n-type wide band gap layer 103 reducing threading dislocations from the substrate interface is different from those obtained by the following methods: a method wherein a film is grown to have a critical film thickness or more, and dislocations newly formed in the film and the threading dislocations from the substrate interface are caused to annihilate each other; a method wherein a lattice-matched layer having its composition gradually changed from the substrate is provided between the substrate and an active layer; and the like. The effect of this embodiment can, with a simple structure suitable for mass production, not only improve crystallinity of the π layer serving as an active layer but also reduce the dark current and diffusion current.

The n-type wide band gap layer 103 has a larger band gap than the first n-type compound semiconductor layer 102, the second n-type compound semiconductor layer 104 and the π layer 105, and is made of a material different in composition from the first n-type compound semiconductor layer 102. When the compositions are different, generally, lattice constants are also different. Accordingly, the n-type wide band gap layer 103 is gradually grown while deforming its entire lattice and being lattice-matched to its underlayer, i.e., the first n-type compound semiconductor layer 102. The film thickness up to which the n-type wide band gap layer 103 can be grown in such a lattice-matched state is the so-called "critical film thickness." On the other hand, as the film thickness is increased and thus the strain energy in the film is increased, dislocations (misfit dislocations) are introduced into the film from the interface to adjust the difference in lattice constant. This is because the energy in the film is lowered by introducing such misfit dislocations into the interface between the film and the underlayer. More specifically, the "critical film thickness" is a maximum film thickness at which the lattice match is absorbed by the lattice distortion without any misfit dislocations being introduced. When the film thickness of the n-type wide band gap layer 103 is made to be the critical film thickness or less, and the first n-type compound semiconductor layer 102 and the second n-type compound semiconductor layer 104 have the same composition, lattice constants of the first n-type compound semiconductor layer 102, the n-type wide band gap layer 103 and the second n-type compound semiconductor layer 104 are matched. For this reason, misfit dislocations can be prevented from newly formed from the interfaces between the n-type wide band gap layer 103 and the first and second n-type compound semiconductor layers 102 and 104. This makes it possible to obtain the n-type wide band gap layer 103 having high crystallinity, and to enhance the above-described effect of suppressing the dark current and diffusion current. Furthermore, not only the above-described effect of reducing the threading dislocations from the interface but also the crystallinity of the π layer serving as the active layer can be improved. Thus, light emission efficiency can be improved. Note that the term "same composition" used herein is intended to include the case where the compositions are identical to the extent that the stress resulting from lattice mismatch does not cause any defects at the interface with the n-type wide band gap layer having the critical film thickness or less, in addition to the case where the compositions are exactly the same.

Figure 4:
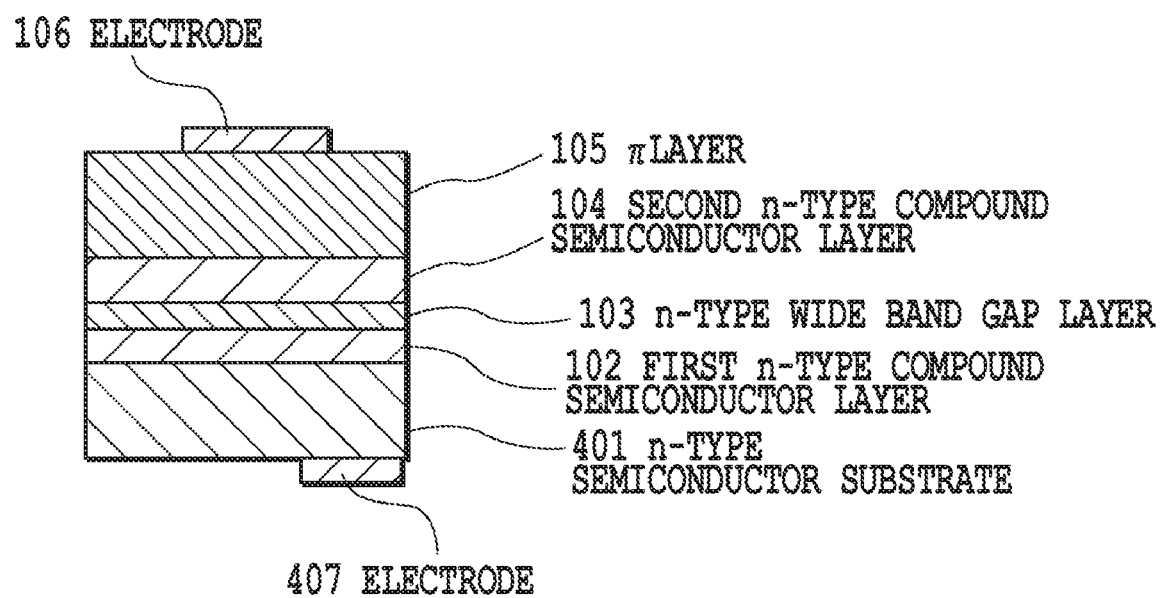
FIG. 4 is a diagram showing a modified embodiment of the infrared light emitting device according to embodiment 1.

As the semiconductor substrate 101, Si, GaAs or the like is usable. The orientations of crystal planes are (100), (111), (110), etc. The semi-insulating semiconductor substrate 101 generally has a band gap larger than 0.41 eV and thus is transparent to infrared light in a long wavelength range. Therefore, extraction of the generated infrared light from the substrate side is not obstructed. The absence of electrodes on the substrate side is preferable because the generated infrared light is not blocked by electrodes. Meanwhile, although the semi-insulating substrate is used in this embodiment, an n-type semiconductor substrate may be used as shown in FIG. 4. In this case, one electrode 407 can be formed on a back surface of the substrate as shown in FIG. 4.

The first n-type compound semiconductor layer 102 is an n-type doped compound semiconductor with a narrow band gap. In the compound semiconductor with a narrow band gap, the mobility of electrons is very high compared with holes. Thus, sheet resistance of the semiconductor layer can be lowered more easily with n-type doping than with p-type doping. Therefore, by doping the first n-type compound semiconductor layer 102 occupying a large area in the device structure with an n-type dopant, sheet resistance of the infrared light emitting device 100 can be easily lowered. The increase in sheet resistance leads to an increase in series resistance connected in series to a diode on an equivalent circuit of the diode. The series resistance is preferably as small as possible because the series resistance consumes the power supplied to the device. As the n-type dopant, Si, Te, Sn, S, Se or the like can be used.

For the same reason as the first n-type compound semiconductor layer 102, n-type doping of the n-type wide band gap layer 103 can be adjusted so that a desired sheet resistance can be obtained. Note that, as described above, the n-type doping of the n-type wide band gap layer 103 also has the effect of shifting the band gap thereof relatively to the valence band direction.

The composition of the n-type wide band gap layer 103 is designed at a proper value in consideration of a required band gap size, ease of thin-film growth, and the like. As an example, when the first and second n-type compound semiconductor layers 102 and 104 are InSb and the n-type wide band gap layer 103 is $In_{1-x}Al_xSb$, Al composition is $0.06 \leq x \leq 0.7$, more preferably $0.1 \leq x \leq 0.5$, and still more preferably $0.15 \leq x \leq 0.3$. The film thickness thereof can be made to be a critical film thickness for each composition or less, but is approximately from 10 nm to 30 nm.

As with the first n-type compound semiconductor layer 102, the second n-type compound semiconductor layer 104 is also an n-type doped compound semiconductor with a narrow band gap. The n-type doping concentration in this case does not have to be the same as those of the first n-type compound semiconductor layer 102 and the n-type wide band gap layer 103. However, it is preferable that the second n-type compound semiconductor layer 104 is doped to the extent that the sheet resistance of the device is not increased. In this regard, the n-type doping concentration of the second n-type compound semiconductor layer 104 may be the same as those of the first n-type compound semiconductor layer 102 and the n-type wide band gap layer 103.

The π layer 105 is a p-type doped π layer. When the n-type wide band gap layer 103 is made to have the critical film thickness, the π layer 105 has the same composition as the first n-type compound semiconductor layer 102 for the same reason given above for the second n-type compound semiconductor layer 104. A doping concentration for p-type doping is preferably not less than $1 \times 10^{16}$ atom/cm$^3$ and less than $1 \times 10^{18}$ atom/cm$^3$, and more preferably not less than $1 \times 10^{16}$ atom/cm$^3$ and less than $1 \times 10^{17}$ atom/cm$^3$. Moreover, the π layer 105 preferably has a film thickness of 0.1 μm to 3 μm, and more preferably 0.5 μm to 2 μm. As a p-type dopant, Be, Zn, Cd, C, Mg, Ge, Cr or the like can be used.

The infrared light emitting device 100 is obtained by sequentially forming the layers on the semiconductor substrate 101, performing element isolation and partial removal of the n layer 105 by chemical etching, and then forming the electrodes 106 and 107. The respective compound semiconductor layers in the infrared light emitting device 100 according to this embodiment can be formed using various film formation techniques. For example, molecular beam epitaxy (MBE), metal-organic vapor-phase epitaxy (MOVPE) or the like is preferable. Moreover, as an element processing method, the following method is employed for example: a step for making contact with the n-type doped layer is first formed using an acid, ion milling or the like. Next, mesa etching is performed for element isolation, and then the resultant structure is covered with a passivation film such as SiN and SiO$_2$. Thereafter, a window is formed only in an electrode portion, and then an electrode such as Ti/Au or Cr/Au is formed using a lift-off technique or the like. Furthermore, a structure having multiple elements connected in series can be constructed using a dedicated mask set.

Note that a layer having the same composition as the first n-type compound semiconductor layer 102 at the interface with the n-type wide band gap layer 103, and having a gradient composition in the film thickness direction can be used as the second n-type compound semiconductor layer 104. By making the composition of the π layer 105 to be the same as the upper surface of the second n-type compound semiconductor layer 104, but different from the first n-type compound semiconductor layer 102, an emission wavelength of the infrared light can be adjusted when the n-type wide band gap layer 103 is made to have the critical film thickness.

Moreover, the π layer 105 may be disposed directly on the n-type wide band gap layer 103. In this configuration, when the n-type wide band gap layer 103 is made to have the critical film thickness, a p-type doped composition transition layer having the same composition as the first n-type compound semiconductor layer 102 at the interface with the n-type wide band gap layer 103 and having a gradient composition in the film thickness direction may be provided between the n-type wide band gap layer 103 and the π layer 105, so that the π layer 105 is allowed to differ in composition from the first n-type compound semiconductor layer 102.

Figure 5:
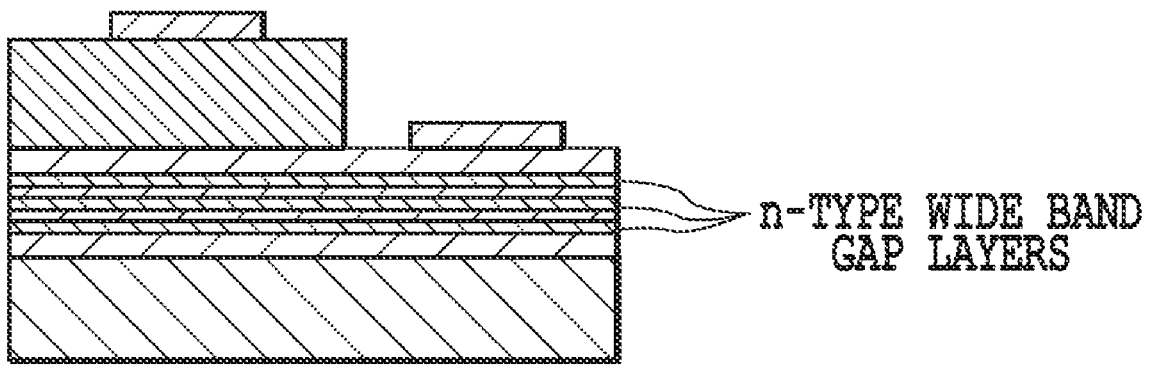
FIG. 5 is a diagram showing a modified embodiment of the infrared light emitting device according to embodiment 1.

Furthermore, by stacking multiple n-type wide band gap layers as shown in FIG. 5, interfaces that can stop dislocations are increased in number and thus the effect of suppressing the propagation of dislocations to the PN junction can be further enhanced. Here, although film thicknesses of the n-type wide band gap layers are all not more than the critical film thickness, the film thickness of each n-type compound semiconductor layer therebetween can be arbitrarily determined in consideration of the total film thickness of layers doped with n-type dopants (hereinafter referred to as the "n-type doped layers"). Moreover, how many n-type wide band gap layers are to be stacked can also be arbitrarily determined in consideration of the total film thickness of the n-type doped layers.

Moreover, heavy doping of the first and second n-type compound semiconductor layers 102 and 104 causes a Burstein-Moss shift to make the layers transparent to the infrared light that is absorbed unless the doping concentration is high. When the infrared light is extracted from the semiconductor substrate 101 side, infrared light generated in the depletion layer portion of the PN junction in the π layer 105 can be efficiently extracted because the semiconductor substrate 101 is transparent to the infrared light and so is the n-type wide band gap layer 103 considering the size of the band gap thereof. As a result, external quantum efficiency of the device can be improved. The doping concentration is preferably not less than $1 \times 10^{18}$ atom/cm$^3$, and more preferably not less than $1 \times 10^{19}$ atom/cm$^3$.

Furthermore, in order to improve the crystallinity of the first n-type compound semiconductor layer 102 grown on the semiconductor substrate 101, a buffer layer is sometimes provided between the semiconductor substrate 101 and the first n-type compound semiconductor layer 102. Specifically, the buffer layer has a lattice constant approximately intermediate between those of the semiconductor substrate 101 and the first n-type compound semiconductor layer 102, and reduces the lattice mismatch. In this case, a material that does not absorb infrared light is selected as the buffer layer.

Although the p-type layer is used as the π layer 105 and the n-type layers are used as the layers other than the π layer 105 in this embodiment, a structure having the n-type and p-type switched achieves an effect that a wide band gap layer suppresses a dark current or diffusion current of electrons and reduces the deterioration of device characteristics due to crystal defects. However, as described above for the first n-type compound semiconductor layer 102, p-type doping increases the sheet resistance of the device. Moreover, a p-type compound semiconductor tends to absorb infrared light in a long wavelength range, and thus makes it difficult to extract the infrared light from the substrate side.

Furthermore, although the infrared light emitting device 100 shown in FIG. 1 has the electrode 107 provided on the second n-type compound semiconductor layer 104, the electrode 107 may be provided in such a way to be connected to the n-type wide band gap layer 103 or the first n-type compound semiconductor layer 102. However, those layers should be large in film thickness to lower the sheet resistance of the n-type doped layer. Thus, the position for the provision of the electrode 107 is preferably immediately above the second n-type compound semiconductor layer as shown in FIG. 1 (or on the upper surface of the n-type doped layers).

Embodiment 2

Figure 6:
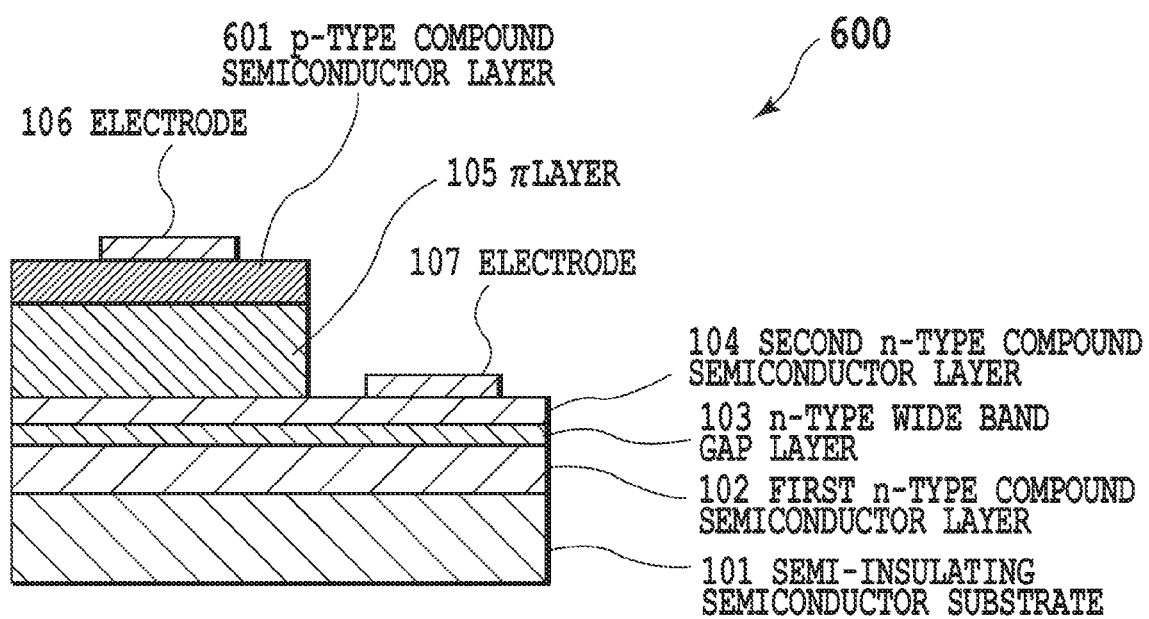
FIG. 6 is a schematic diagram of an infrared light emitting device according to embodiment 2.

FIG. 6 shows an infrared light emitting device 600 according to embodiment 2. The structure from the semiconductor substrate 101 to the π layer 105 is the same as that of embodiment 1, and similar modifications are conceivable. The infrared light emitting device 600 further includes a p-type compound semiconductor layer 601 which is disposed on the n layer 105, is more heavily p-type doped than the π layer 105, and has the same composition as the first n-type compound semiconductor layer or the π layer. This structure is a so-called PIN diode structure.

Since the p-type compound semiconductor layer 601 is more heavily p-type doped than the π layer 105, electrons injected from n-type doped layers (101 to 104) side can be more efficiently trapped in the π layer than the example of embodiment 1. As a result, recombination emission efficiency of carriers can be enhanced. Furthermore, the heavy p-type doping can lower contact resistance with an electrode 106. The p-type doping concentration of the p-type compound semiconductor layer 601 is preferably not less than $7 \times 10^{17}$ atom/cm$^3$, and more preferably not less than $1 \times 10^{18}$ atom/cm$^3$.

Embodiment 3

Figure 7:
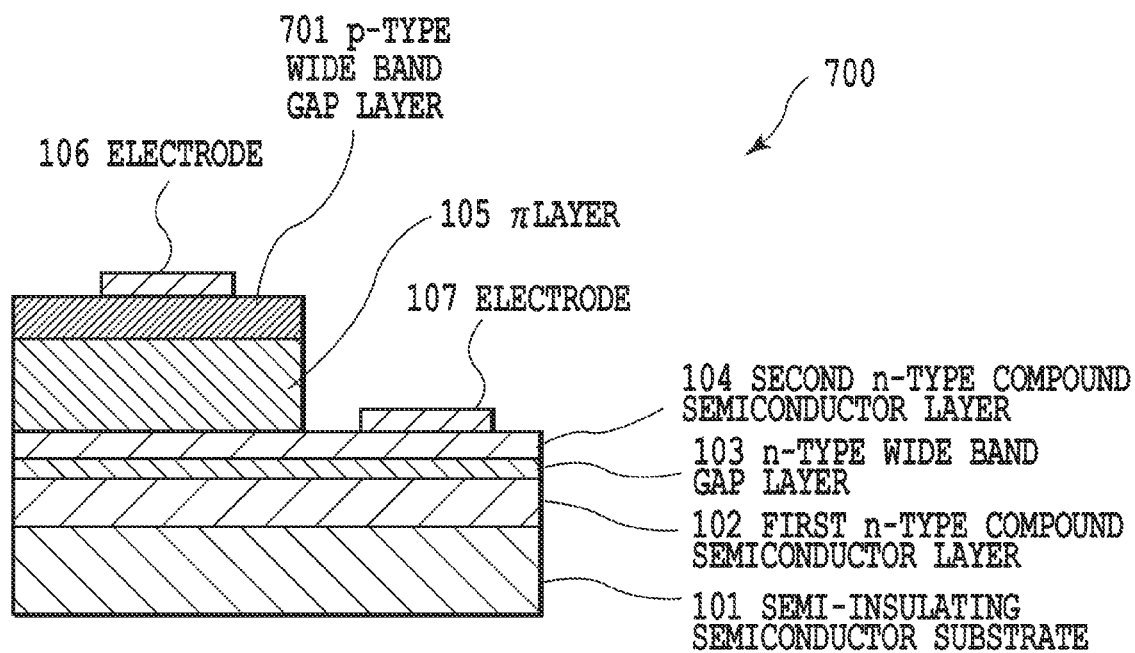
FIG. 7 is a schematic diagram of an infrared light emitting device according to embodiment 3.

FIG. 7 shows an infrared light emitting device 700 according to embodiment 3. The structure from the semiconductor substrate 101 to the π layer 105 is the same as that of embodiment 1, and similar modifications are conceivable. The infrared light emitting device 700 further includes a p-type wide band gap layer 701 which is disposed directly on the π layer 105, is more heavily p-type doped than the π layer 105, and has a larger band gap than a first n-type compound semiconductor layer 102 and the π layer 105. This structure is also the so-called PIN diode structure.

Figure 8:
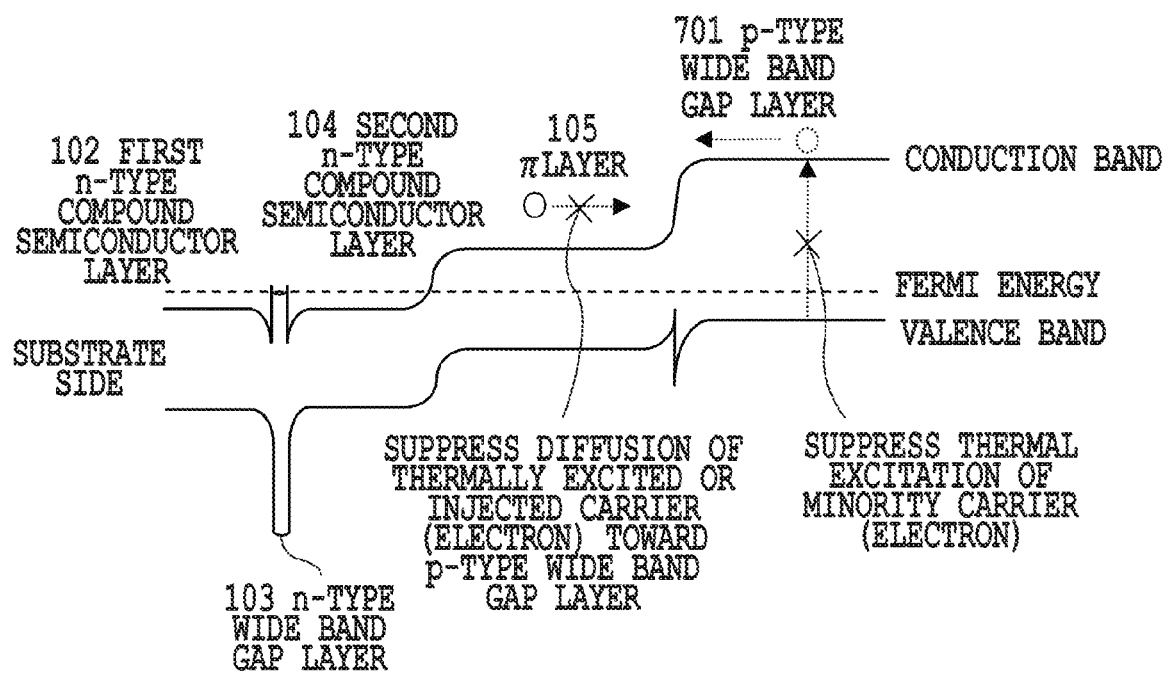
FIG. 8 is a band diagram of the infrared light emitting device according to embodiment 3.

FIG. 8 is a schematic diagram of the energy band gap in the infrared light emitting device according to embodiment 3. By making the band gap of the p-type wide band gap layer 701 to be larger than those of the first n-type compound semiconductor layer 102 and the π layer 105, generation of electrons as minority carriers by thermal excitation in the p-type wide band gap layer 701 can be effectively suppressed. Accordingly, a dark current of electrons flowing from the p-type wide band gap layer 701 toward the π layer 105 is suppressed. At the same time, a diffusion current of electrons which are generated by thermal excitation in the π layer 105 and flowing toward the p-type wide band gap layer 701 is suppressed. Thus, reduction in the diode resistance can be effectively suppressed.

Here, the p-type wide band gap layer 701 has a wide band gap that does not allow generation of infrared light in a long wavelength range. This, however, does not cause a problem because infrared light generation is done in the π layer 105. Moreover, electrons injected from the side of the n-type doped layers (101 to 104) can be further prevented from diffusing into the p-type wide band gap layer 701 compared with the case of embodiment 2. As a result, recombination emission efficiency of electrons and holes can be further enhanced in the π layer 105.

The composition of the p-type wide band gap layer 701 is designed at a proper value in consideration of a required band gap size, ease of thin-film growth, and the like. As an example, when the compound semiconductor with a narrow band gap is InSb and the p-type wide band gap layer is $In_{1-x}Al_xSb$, Al composition is $0.06 \leq x \leq 0.7$, more preferably $0.1 \leq x \leq 0.5$, and still more preferably $0.15 \leq x \leq 0.3$. Moreover, the p-type doping concentration of the p-type wide band gap layer 701 is preferably not less than 7×10$^{17}$ atom/cm$^3$, and more preferably not less than 1×10$^{18}$ atom/cm$^3$.

Embodiment 4

Figure 9:
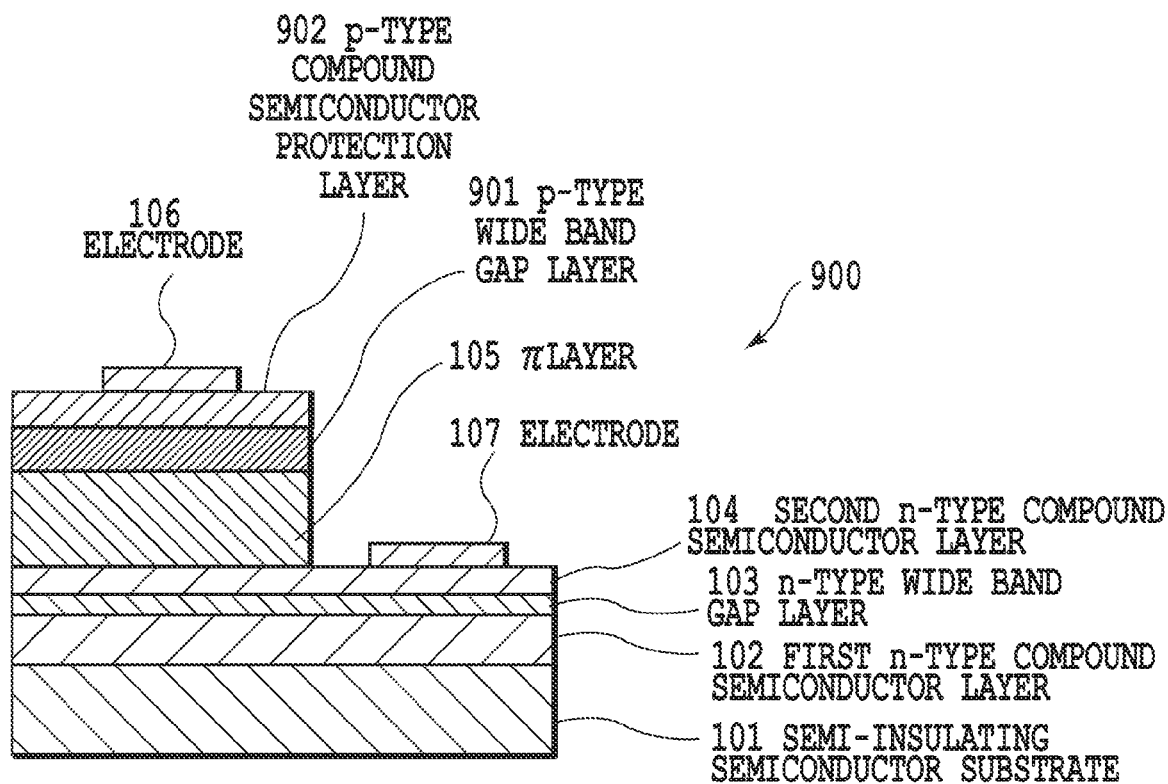
FIG. 9 is a schematic diagram of an infrared light emitting device according to embodiment 4.

FIG. 9 shows an infrared light emitting device 900 according to embodiment 4. The structure from the semiconductor substrate 101 to the π layer 105 is the same as that of embodiment 1, and similar modifications are conceivable. The infrared light emitting device 900 is the same as embodiment 3 in further including a p-type wide band gap layer which is disposed on the π layer 105, is more heavily p-type doped than the π layer 105, and has a larger band gap than a first n-type compound semiconductor layer 102 and the π layer 105. In the present embodiment, a film thickness of a p-type wide band gap layer 901 is a critical film thickness or less (approximately from 10 nm to 30 nm). In this way, lattice defects such as misfit dislocations are prevented from occurring at the interface with the π layer 105. As a result, crystallinity of the p-type wide band gap layer 901 can be improved, and a leak current caused by the lattice defects can be suppressed. Furthermore, in the present embodiment, the infrared light emitting device 900 includes a p-type compound semiconductor protection layer 902 on the p-type wide band gap layer 901. The p-type compound semiconductor protection layer 902 is more heavily p-type doped than the π layer 105. The film thickness of the p-type wide band gap layer 901 is not more than the critical film thickness and the layer is very thin. Therefore, when an electrode is formed directly on the p-type wide band gap layer 901, the layer can be damaged in some way during an electrode formation process. The p-type compound semiconductor protection layer 902 has a role in protecting the p-type wide band gap layer 901 from such damages.

Note that the p-type compound semiconductor protection layer 902 serves as a contact layer with an electrode 106. A contact resistance with the electrode becomes a series resistance on an equivalent circuit, and consumes power of the light emitting device. Therefore, in order to lower the contact resistance between the p-type compound semiconductor protection layer 902 and the electrode 106, the p-type compound semiconductor protection layer 902 is preferably p-type doped at the same concentration as the p-type wide band gap layer 901 or more. Particularly, the p-type doping concentration is preferably not less than 7×10$^{17}$ atom/cm$^3$, and more preferably not less than 1×10$^{18}$ atom/cm$^3$. Moreover, the p-type compound semiconductor protection layer 902 has a film thickness of preferably 0.05 µm to 1 µm, and more preferably 0.1 µm to 0.7 µm.

Since the p-type compound semiconductor protection layer 902 serves as the contact layer with the electrode 106 as described above, a film sheet resistance thereof is preferably small. Accordingly, a band gap of the p-type compound semiconductor protection layer 902 is preferably smaller than that of the p-type wide band gap layer 801. This is because a semiconductor having a small band gap has a small film sheet resistance. Here, by setting the p-type compound semiconductor protection layer 902 to have the same composition as the first n-type compound semiconductor layer 102 or the n layer 105, the film sheet resistance thereof can also be reduced because of the small band gap. Furthermore, since the p-type compound semiconductor protection layer 902 has a lattice constant close to that of the p-type wide band gap layer 901 having the critical film thickness or less, the p-type compound semiconductor protection layer 902 provides no stress to the p-type wide band gap layer 901. Thus, crystallinity thereof can be further improved. Particularly when the p-type compound semiconductor protection layer 902 has the same composition as the π layer 105, lattice constants of the π layer 105, the p-type wide band gap layer 901 and the p-type compound semiconductor protection layer 902 are matched. This is preferable since a film having high crystallinity can be grown.

Figure 10:
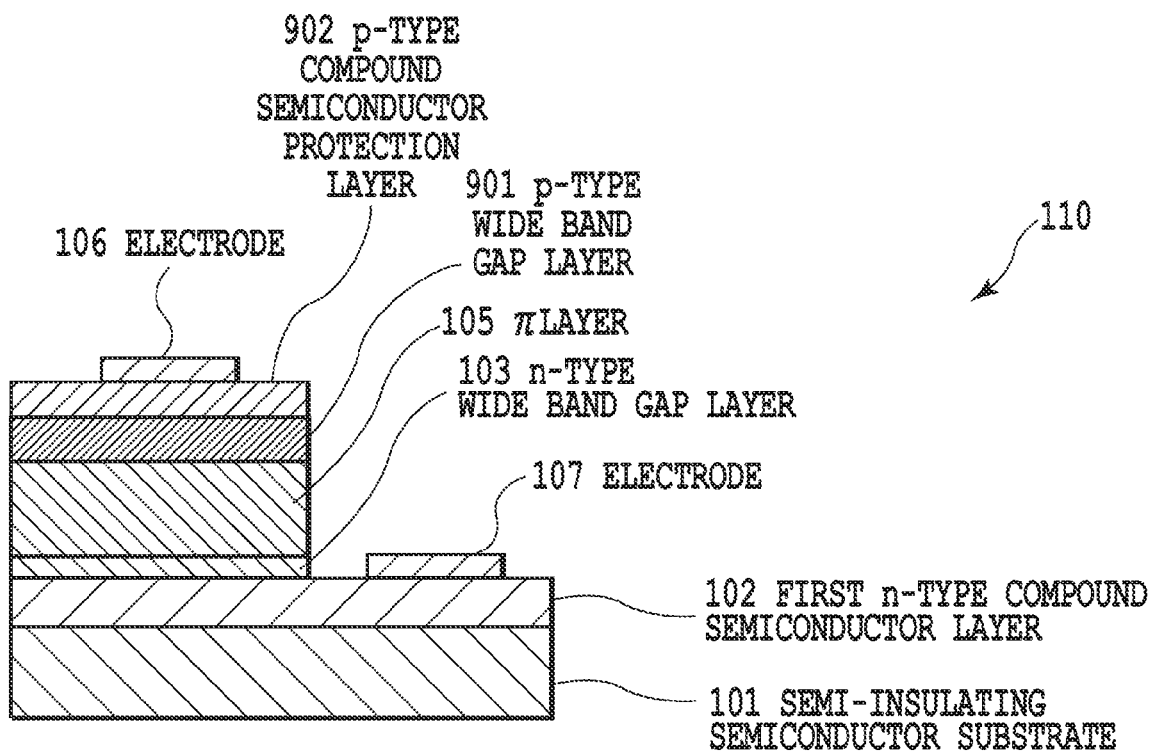
FIG. 10 is a diagram showing a modified embodiment of the infrared light emitting device according to embodiment 4.

FIG. 10 shows a modified embodiment 110 of the infrared light emitting device 900. The infrared light emitting device 110 has a structure having a π layer 105 disposed directly on an n-type wide band gap layer 103 as described in embodiment 1. When this structure is used as the light emitting device in particular, the π layer 105 that is a light emitting layer is sandwiched between the n-type wide band gap layer 103 and a p-type wide band gap layer 901. Thus, carriers can be effectively trapped inside the π layer 105. This is, therefore, preferable since recombination emission efficiency of the device can be enhanced.

Figure 11:
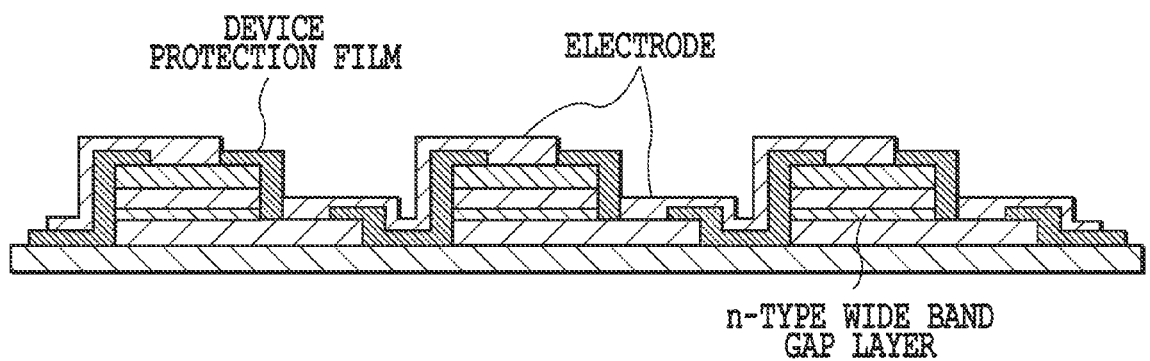
FIG. 11 is a schematic diagram of an infrared light emitting device according to embodiment 5.

FIG. 11 shows a structure having multiple infrared light emitting devices provided on a semiconductor substrate. The respective infrared light emitting devices are connected in series by electrodes. The structure shown in FIG. 10 can be obtained by performing element isolation and partial removal of layers by chemical etching, then stacking an insulating protection film on the resultant structure, forming windows in contact portions with the devices, and then forming the electrodes so that the devices can be connected in series. Such a structure cannot be realized with a conductive substrate such as an InSb substrate.

In the case of light emitting device, by connecting multiple devices in series as described above, a more amount of light proportional to the number of the devices connected can be obtained. In this case as well, when series resistance components other than the diode resistance of the device, i.e., resistances such as a film sheet resistance of an n-type doped layers and a contact resistance with the electrode, are large, unnecessary input power is required and heat generated by the device is also increased. For this reason, the series resistance components other than the diode resistance are preferably small.

Example 1

An examination was made on a film thickness of the first n-type compound semiconductor layer which is suitable for obtaining an effect of propagation suppression of crystal defects by an n-type wide band gap layer.

The first n-type compound semiconductor layer to be first grown on a semiconductor substrate goes through the following growth process. Specifically, since the first n-type compound semiconductor layer is hetero-grown with a large lattice mismatch with the substrate material, it is therefore grown in island shapes at first and then the grown islands come into contact with each other and are connected to form a continuous film. Therefore, when a film thickness is very small, sometimes the continuous film cannot be formed or sufficient crystallinity cannot be obtained even if the continuous film is formed. When an n-type wide band gap layer is grown on the first n-type compound semiconductor layer with such crystallinity, the n-type wide band gap layer cannot obtain sufficient crystallinity due to the influence of the crystallinity of the first n-type compound semiconductor layer therebelow. As a result, the n-type wide band gap layer cannot fulfill a sufficient effect of propagation suppression of crystal defects.

Here, in growing an InSb film of 1 µm in total on a GaAs substrate, an n-type wide band gap layer Al$_{0.17}$In$_{0.83}$Sb having a film thickness of 20 nm was inserted at a position 0.1 µm, 0.2 μm or 0.3 μm away from the substrate. By etching the InSb film with an etchant of HF (hydrofluoric acid):HNO$_3$ (nitric acid):H$_2$O (water)=1:1:3, dislocation portions reaching the surface, so-called threading dislocations were obtained as etch pits. Counting the number of the etch pits allows to obtain the number of dislocations reaching the film surface.

Figure 12:
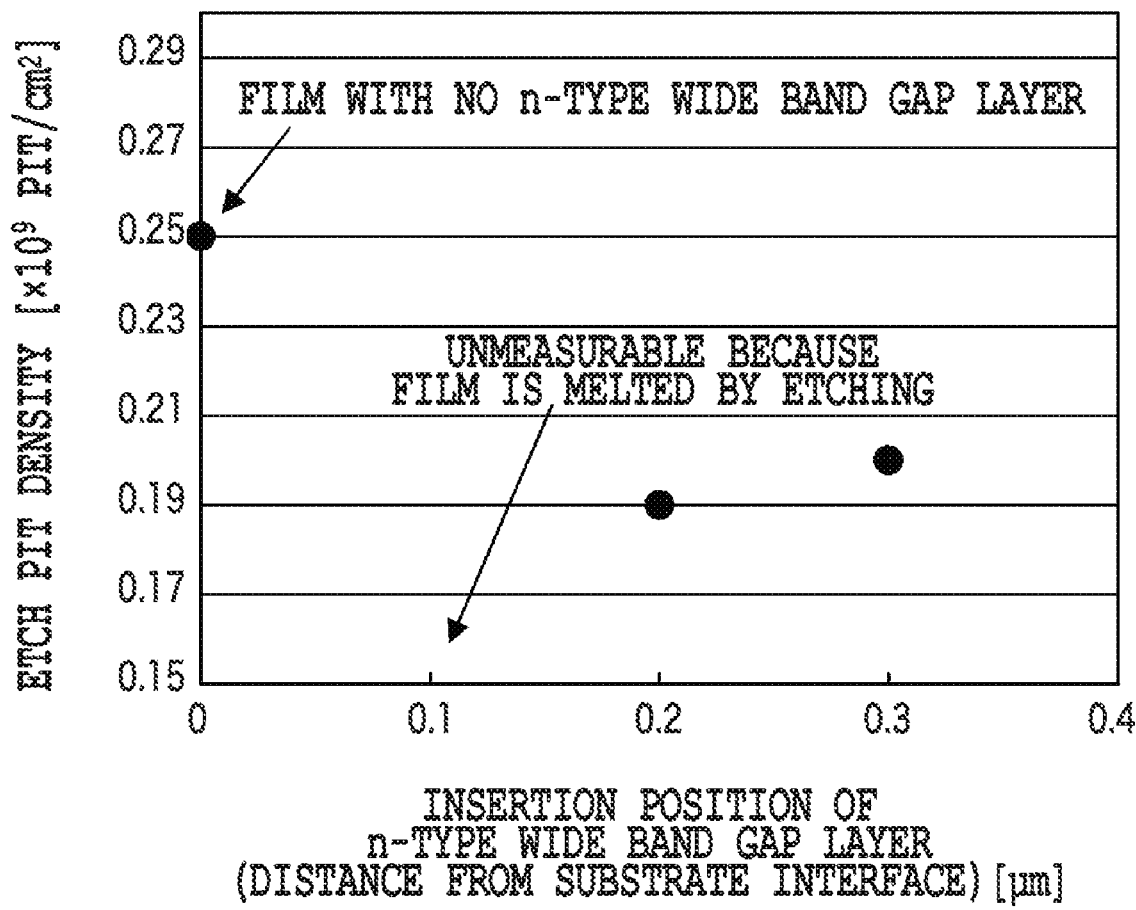
FIG. 12 is a graph showing a relationship between a film thickness of the first n-type compound semiconductor layer and an etch pit density.

FIG. 12 is a graph showing a relationship between the number of the etch pits thus obtained and the insertion position of the n-type wide band gap layer Al$_{0.17}$In$_{0.83}$Sb. As is seen from FIG. 12, when the n-type wide band gap layer Al$_{0.17}$In$_{0.83}$Sb is inserted at the position 0.2 μm or 0.3 μm away from the substrate, the number of threading dislocations is reduced by 20% or more compared with the film with no n-type wide band gap layer Al$_{0.17}$In$_{0.83}$Sb. In other words, the n-type wide band gap layer Al$_{0.17}$In$_{0.83}$Sb effectively suppresses the propagation of crystal defects. On the other hand, when the n-type wide band gap layer Al$_{0.17}$In$_{0.83}$Sb is inserted at the position 0.1 μm away from the substrate, the InSb film itself is melted by etching. Namely, this shows that crystallinity of the film is deteriorated by contraries. Therefore, the n-type wide band gap layer is preferably inserted at the position more than 0.1 μm away from the substrate. In other words, the film thickness of the first n-type compound semiconductor layer preferably exceeds 0.1 μm.

On the other hand, when the film thickness thereof is too large, film growth takes longer. For this reason, the film thickness of the first n-type compound semiconductor layer is preferably 0.1 μm<x≦3.0 μm, more preferably 0.2 μm≦x≦2.0 μm, and still more preferably 0.3 μm≦x≦1.0 μm.

A total film thickness of the first and second n-type compound semiconductor layers needs only be larger than 0.1 μm, but is preferably larger than 0.1 μm and not more than 3 μm, and more preferably 0.7 μm to 2 μm.

Example 2

Example 2-1

The device structure shown in FIG. 10 was fabricated by MBE. First, an InSb layer (first n-type compound semiconductor layer) doped with Sn (n-type dopant) at 1.0×10$^{19}$ atom/cm$^3$ was grown for 1.0 μm on the (001) plane of a semi-insulating GaAs single-crystal substrate. Then, an Al$_{0.17}$In$_{0.83}$Sb layer (n-type wide band gap layer) similarly doped with Sn (n-type dopant) at 1.0×10$^{19}$ atom/cm$^3$ was grown for 0.02 μm thereon. Thereafter, an InSb layer (n layer) doped with Zn (p-type dopant) at 6.0×10$^{16}$ atom/cm$^3$ was grown for 1.0 μm thereon. Subsequently, an Al$_{0.17}$In$_{0.83}$Sb layer (p-type wide band gap layer) doped with Zn (p-type dopant) at 2.0×10$^{18}$ atom/cm$^3$ was grown for 0.02 μm thereon. Lastly, an InSb layer (p-type compound semiconductor protection layer) doped with Zn (p-type dopant) at 2.0×10$^{18}$ atom/cm$^3$ was grown for 0.5 μm thereon. Here, each of the InSb layers has a band gap of 0.18 eV at room temperature, and each of the Al$_{0.17}$In$_{0.83}$Sb layers has a band gap of 0.46 eV at room temperature. This goes the same for other examples and comparative examples.

A cross-sectional TEM (transmission electron microscope) observation was made on the infrared light emitting device thus fabricated. First, the device was sliced into thin pieces by ion milling and then observed at an accelerating voltage of 300 kV using a HITACHI H-9000NAR electron microscope.

Figure 13A:
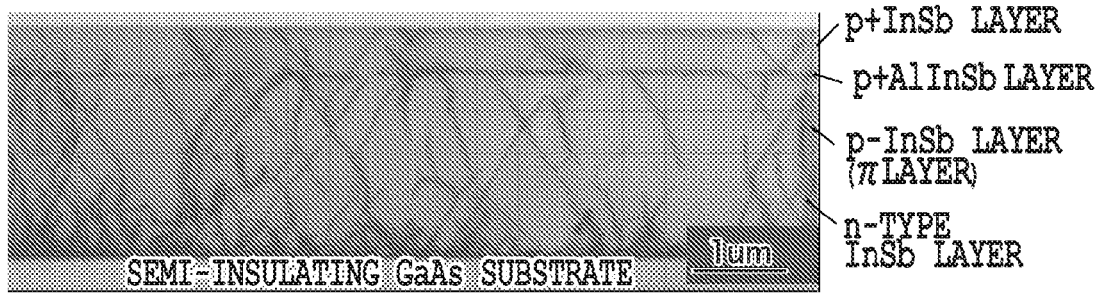
FIG. 13A is a diagram showing a result of cross-sectional TEM (transmission electron microscope) observation in comparative example 2-1.
Figure 13B:
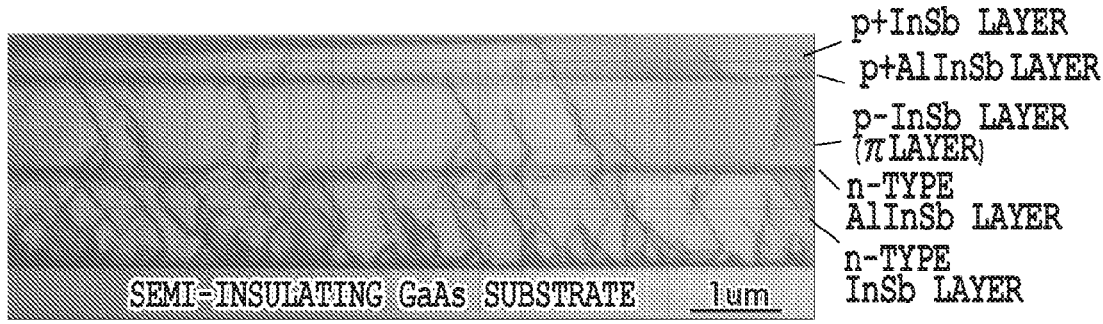
FIG. 13B is a diagram showing a result of cross-sectional TEM (transmission electron microscope) observation in example 2-1.

FIG. 13B shows the observation result at a magnification of 12500×. Oblique lines seen in FIG. 13B are dislocations. As is seen from the picture, dislocations formed from the interface with the substrate are bent by the n-type Al$_{0.17}$In$_{0.83}$Sb layer (n-type wide band gap layer) between the n-type InSb layer and the π layer. The picture clearly shows an effect that propagation of dislocations to the π layer is significantly suppressed.

Note that it was confirmed from the cross-sectional TEM picture and a result of reciprocal lattice mapping on the (115) plane using X-ray diffraction that the film thickness 0.02 μm of the Al$_{0.17}$In$_{0.83}$Sb layer is not more than the critical film thickness relative to the InSb layer therebelow and that the InSb layer and the Al$_{0.17}$In$_{0.83}$Sb layer are perfectly lattice-matched in a direction parallel to the film surface.

Comparative Example 2-1

A structure obtained by removing the Al$_{0.17}$In$_{0.83}$Sb layer (n-type wide band gap layer) from example 2-1 is prepared. FIG. 13A shows a result of a cross-sectional TEM observation made on the fabricated device under the same conditions as those of example 2-1. As is seen from FIG. 13A, dislocations formed at the interface penetrate the π layer.

Example 2-2

In the device structure shown in FIG. 10, a structure obtained by inserting five n-type wide band gap layers into the first n-type compound semiconductor layer as shown in FIG. 5 was fabricated by MBE. First, an InSb layer doped with Sn (n-type dopant) at 1.0×10$^{19}$ atom/cm$^3$ was grown for 0.5 μm on the (001) plane of a semi-insulating GaAs single-crystal substrate. Then, an Al$_{0.17}$In$_{0.83}$Sb layer (n-type wide band gap layer) similarly doped with Sn (n-type dopant) at 1.0×10$^{19}$ atom/cm$^3$ was grown for 0.02 μm thereon. Thereafter, an InSb layer doped with Sn (n-type dopant) at 1.0×10$^{19}$ atom/cm$^3$ was grown for 0.02 μm thereon. Subsequently, the same 0.02 μm thick Al$_{0.17}$In$_{0.83}$Sb layers (n-type wide band gap layers) and 0.02 μm thick InSb layers were alternately stacked until a total of five Al$_{0.17}$In$_{0.83}$Sb layers (n-type wide band gap layers) were stacked. On the fifth Al$_{0.17}$In$_{0.83}$Sb layer (n-type wide band gap layer), an InSb layer doped with Sn (n-type dopant) at 1.0×10$^{19}$ atom/cm$^3$ was grown for 0.3 μm thereon. Thereafter, an Al$_{0.17}$In$_{0.83}$Sb layer doped with Sn (n-type dopant) at 1.0×10$^{19}$ atom/cm$^3$ was further grown for 0.02 μm thereon. The n-type doped layers (Sn-doped layers) thus grown so far have a total film thickness of 1 μm. An InSb layer (n layer) doped with Zn (p-type dopant) at 6.0×10$^{16}$ atom/cm$^3$ was grown for 1.0 μm thereon. Subsequently, an Al$_{0.17}$In$_{0.83}$Sb layer (p-type wide band gap layer) doped with Zn (p-type dopant) at 2.0×10$^{18}$ atom/cm$^3$ was grown for 0.02 μm thereon. Lastly, an InSb layer (p-type compound semiconductor protection layer) doped with Zn (p-type dopant) at 2.0×10$^{18}$ atom/cm$^3$ was grown for 0.2 μm thereon.

Figure 13C:
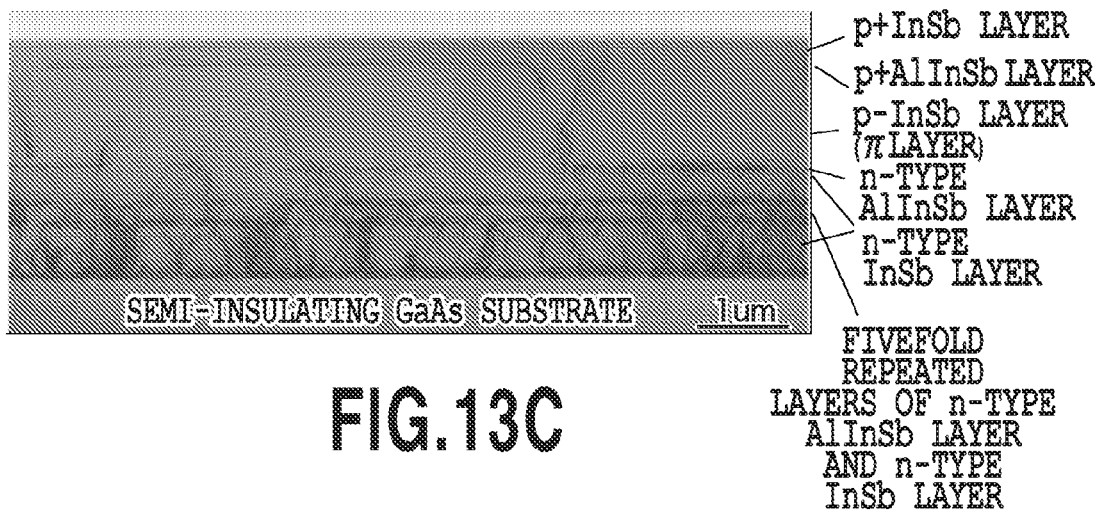
FIG. 13C is a diagram showing a result of cross-sectional TEM (transmission electron microscope) observation in example 2-2.

FIG. 13C shows a result of a cross-sectional TEM observation made on the thus fabricated infrared light emitting device under the same conditions as those of example 2-1. FIG. 13C shows that propagation of dislocations formed at the interface is more effectively suppressed by the inserted five Al$_{0.17}$In$_{0.83}$Sb layers.

Example 2-3

A PIN diode was fabricated using the structure of example 2-1 by the following procedures. First, a step for making contact with an n-type doped layer was formed by etching with an acid. Then, a compound semiconductor thin film with the step formed thereon was mesa-etched for element isolation. Thereafter, the entire surface (the GaAs substrate and the compound semiconductor structure formed thereon) was covered with a SiN protective film using plasma CVD. Subsequently, a window was formed in an electrode portion on the SiN protection film thus formed, and then Au/Ti (Ti is on the film side) was EB evaporated to form an electrode using a lift-off technique. The PN junction had an octagonal shape and was designed to have an area of 120.7 μm². Besides, another PIN diode was fabricated using the structure of comparative example 2-1.

Figure 14:
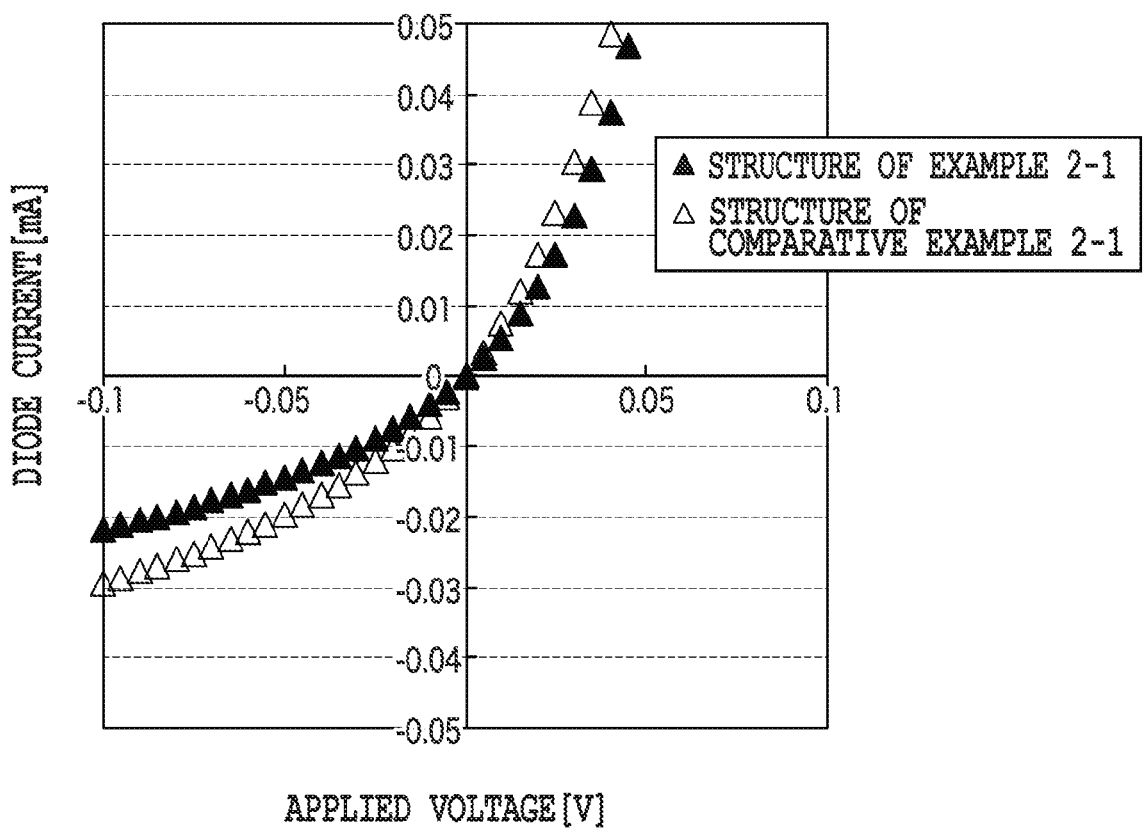
FIG. 14 is a graph showing current-voltage characteristics of PIN diodes using structures of comparative example 2-1 and example 2-1.

FIG. 14 shows current-voltage characteristics of the PIN diodes thus fabricated. In the PIN diode using the structure of example 2-1, a current at a reverse bias, i.e. a dark current of the diode is reduced compared with that using the structure of comparative example 2-1. Moreover, a current rise at a positive bias is shifted toward larger biases. This is an effect that a diffusion current of the diode is suppressed.

Example 2-4

A PIN diode was fabricated using the structure of example 2-1 taking the same procedures as example 2-3. However, the PN junction was designed to have a circular shape with a diameter of 500 μm. The device thus prepared is much larger than that of example 2-3.

The PIN diode thus fabricated was evaluated for its emission characteristics by taking the following procedures. First, the PIN diode was attached to a glass epoxy substrate having a hole provided therein to extract light. Then, the electrode and a terminal on the glass epoxy substrate were connected by wire bonding. Thereafter, a pulse current having a frequency of 1 kHz, a duty cycle of 50% and a current value of 100 mA (peak-to-peak value) was introduced into the device from the terminal using a pulse generator to drive it as a light emitting device. Evaluation of the emission characteristics was performed by measuring infrared light extracted from the hole in the glass epoxy substrate using a FTIR (Fourier transform infrared spectroscopy). The FTIR used is Nexus 870 FTIR manufactured by Nicolet Corporation. Note that the measurement was performed at room temperature (25° C.), and cooling of the device or the like was not performed during the measurement. Furthermore, the same PIN diode structure was fabricated using the structure of comparative example 2-1, and then emission characteristics were evaluated.

Figure 15:
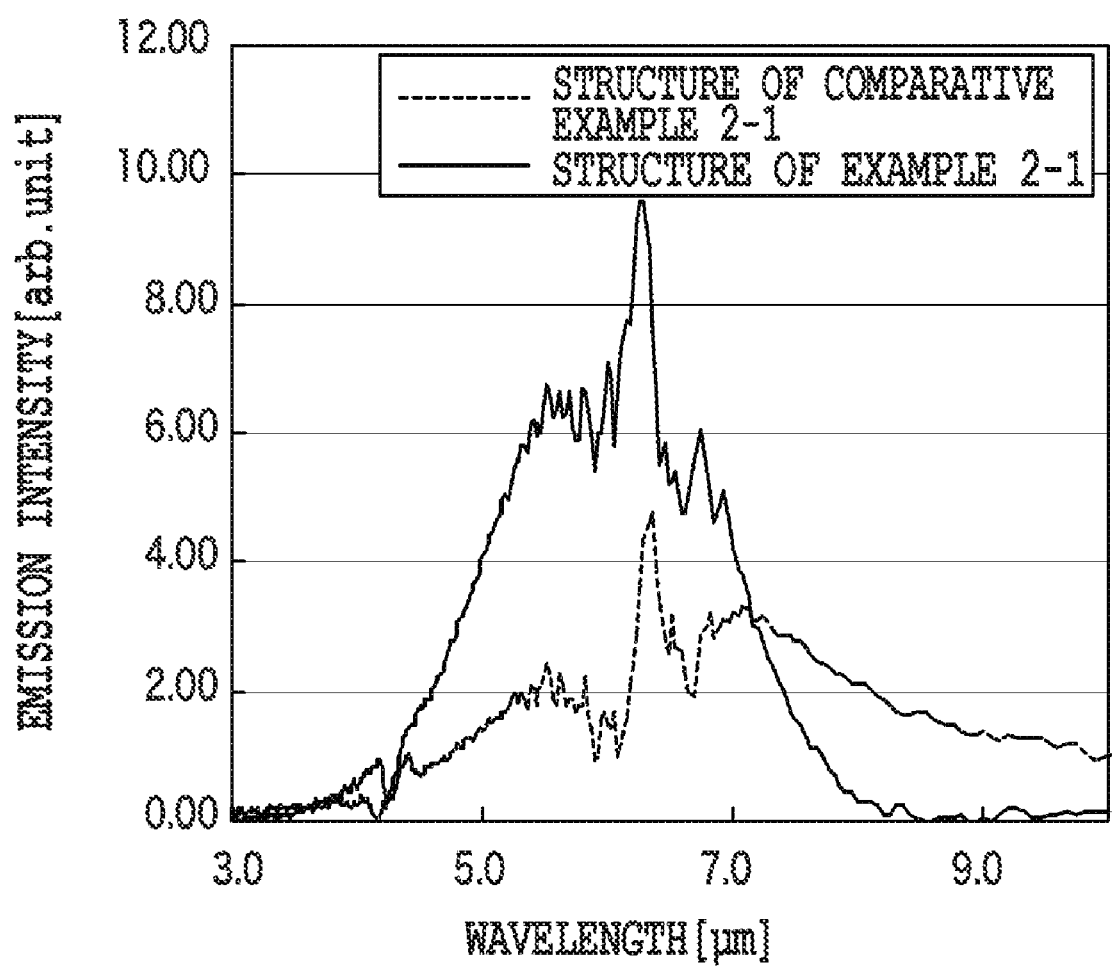
FIG. 15 is a graph showing emission characteristics of the PIN diodes using the structures of comparative example 2-1 and example 2-1.

FIG. 15 shows a standardized result of emission intensity of infrared light obtained by measurement with respect to each spectral wavelength. Specifically, the emission intensity is standardized by dividing the obtained emission intensity by a value of bias voltage x bias current (100 mA). It was observed that, compared with the PIN diode using the structure of comparative example 2-1 with no n-type wide band gap layer, the emission intensity is significantly increased by about 2.3 times at the peak wavelength of 6.3 μm in the PIN diode using the structure of example 2-1.

Example 2-5

Figure 16:
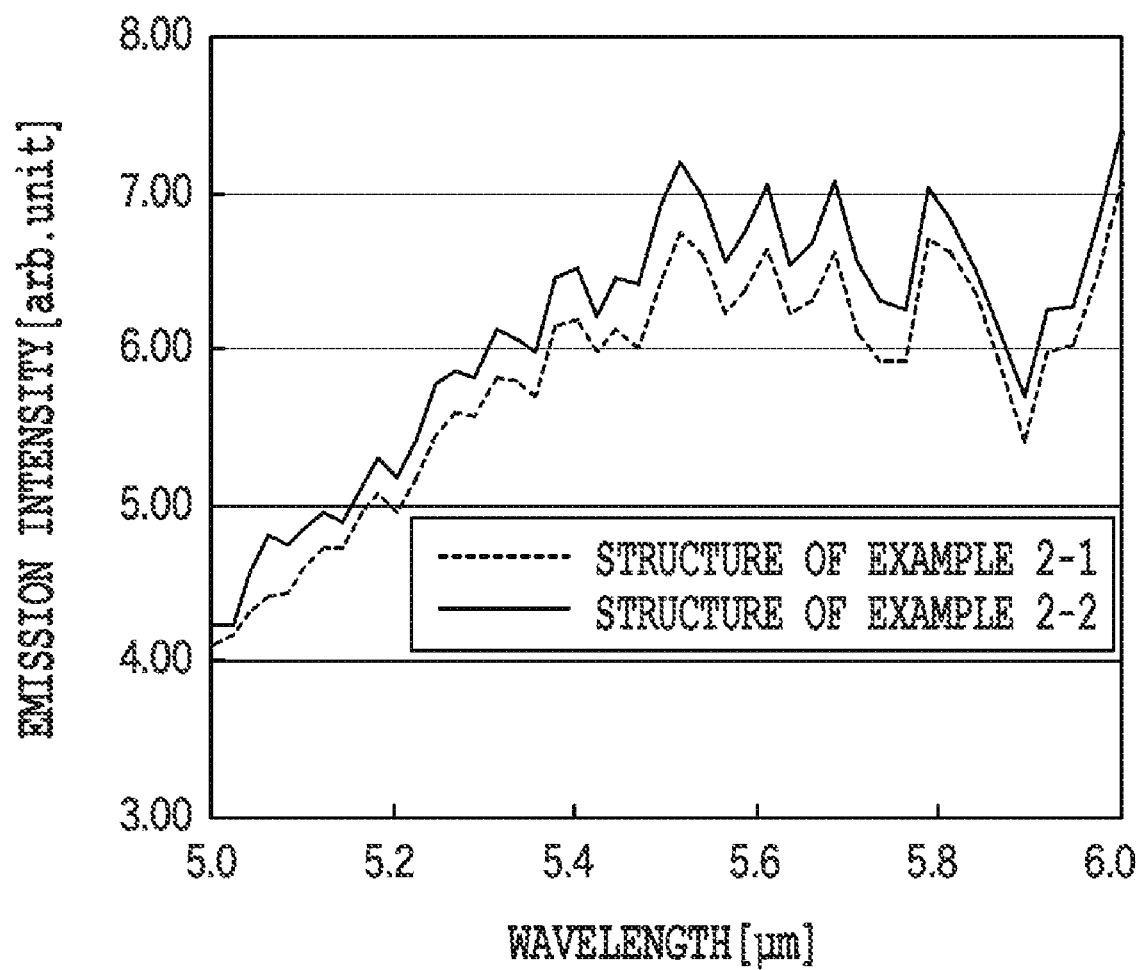
FIG. 16 is a graph showing emission characteristics of the PIN diodes using the structures of example 2-1 and example 2-2.

The same PIN diode structure as that of example 2-4 was fabricated using the structure of example 2-2, and then emission characteristics thereof were evaluated. FIG. 16 shows emission intensities of the PIN diode of example 2-4 with the structure of example 2-1 and the PIN diode of this example within a range of wavelengths 5 μm to 6 μm. This wavelength range is a range within which a difference between the two PIN diodes is most clearly seen. In the PIN diode of this example, a much larger emission intensity than that of example 2-4 is obtained.

The invention claimed is:

1. An infrared light emitting device, comprising:
a semiconductor substrate;
a first n-type compound semiconductor layer on the semiconductor substrate;
an n-type wide band gap layer on the first n-type compound semiconductor layer; and
a p-type doped π layer on the n-type wide band gap layer,
wherein each of the layers other than the n-type wide band gap layer has a band gap of 0.41 eV or less, and
wherein the n-type wide band gap layer has a larger band gap than the first n-type compound semiconductor layer and the π layer.

2. The infrared light emitting device according to claim 1, wherein the π layer is disposed directly on the n-type wide band gap layer.

3. The infrared light emitting device according to claim 1, further comprising a second n-type compound semiconductor layer between the n-type wide band gap layer and the π layer, the second n-type compound semiconductor layer having the same composition as the first n-type compound semiconductor layer.

4. The infrared light emitting device according to claim 1, wherein the π layer has the same composition as the first n-type compound semiconductor layer, and
wherein the n-type wide band gap layer has a film thickness of a critical film thickness or less.

5. An infrared light emitting device, comprising:
a semiconductor substrate;
a first n-type compound semiconductor layer on the semiconductor substrate;
an n-type wide band gap layer on the first n-type compound semiconductor layer, the n-type wide band gap layer having a film thickness of a critical film thickness or less;
a second n-type compound semiconductor layer on the n-type wide band gap layer, the second n-type compound semiconductor layer having the same composition as the first n-type compound semiconductor layer at an interface with the n-type wide band gap layer, and having a gradient composition in the film thickness direction; and
a p-type doped π layer on the second n-type compound semiconductor layer, the π layer having the same composition as the second n-type compound semiconductor layer at an interface with the second n-type compound semiconductor layer,
wherein each of the layers other than the n-type wide band gap layer has a band gap of 0.41 eV or less, and
the n-type wide band gap layer has a larger band gap than the first n-type compound semiconductor layer and the π layer.

6. An infrared light emitting device, comprising:
a semiconductor substrate;
a first n-type compound semiconductor layer on the semiconductor substrate;
an n-type wide band gap layer on the first n-type compound semiconductor layer, the n-type wide band gap layer having a film thickness of a critical film thickness or less;
a p-type doped composition transition layer on the n-type wide band gap layer, the p-type doped composition transition layer having the same composition as the first n-type compound semiconductor layer at an interface with the n-type wide band gap layer, and having a gradient composition in the film thickness direction; and a p-type doped π layer on the composition transition layer, the π layer having the same composition as the composition transition layer at an interface with the composition transition layer,
wherein each of the layers other than the n-type wide band gap layer has a band gap of 0.41 eV or less, and
wherein the n-type wide band gap layer has a larger band gap than the first n-type compound semiconductor layer and the π layer.

7. The infrared light emitting device according to any of claims 1, 5, and 6,
wherein each of the first n-type compound semiconductor layer and the π layer is made of InAs, InSb, InAsSb or InSbN, and
wherein the n-type wide band gap layer is made of AlInSb, GaInSb or AlAs, GaAs, AlSb, GaSb, or a mixed crystal of those compounds.

8. The infrared light emitting device according to any of claims 1, 5, and 6, wherein the n-type wide band gap layer is doped at the same concentration as the first n-type compound semiconductor layer.

9. The infrared light emitting device according to any of claims 1, 5, and 6, further comprising a p-type compound semiconductor layer disposed on the π layer, the p-type compound semiconductor layer being p-type doped at a higher concentration than the π layer, and having the same composition as the first n-type compound semiconductor layer or the π layer.

10. The infrared light emitting device according to any of claims 1, 5, and 6, further comprising a p-type wide band gap layer disposed directly on the π layer, the p-type wide band gap layer being p-type doped at a higher concentration than the π layer, and having a larger band gap than the first n-type compound semiconductor layer and the π layer.

11. The infrared light emitting device according to claim 10,
wherein each of the first n-type compound semiconductor layer and the π layer is made of InAs, InSb, InAsSb or InSbN, and
wherein each of the n-type wide band gap layer and the p-type wide band gap layer is made of AlInSb, GaInSb or AlAs, GaAs, AlSb, GaSb, or a mixed crystal of those compounds.

12. The infrared light emitting device according to claim 10,
wherein the p-type wide band gap layer has a film thickness of a critical film thickness or less,
the device further comprising a p-type compound semiconductor protection layer on the p-type wide band gap layer, the p-type compound semiconductor protection layer being doped at least at the same concentration as the p-type wide band gap layer.

13. The infrared light emitting device according to claim 12, wherein the p-type doped compound semiconductor protection layer has the same composition as any one of the first n-type compound semiconductor layer and the π layer.

14. The infrared light emitting device according to any of claims 1, 5, and 6, wherein the film thickness of the first n-type compound semiconductor layer exceeds 0.1 μm.

15. The infrared light emitting device according to any of claims 1, 5, and 6,
wherein the semiconductor substrate is a semi-insulating semiconductor substrate, or a semiconductor substrate wherein the semiconductor substrate and the first n-type compound semiconductor layer formed on the semiconductor substrate are electrically isolable,
the device further comprising:
a first electrode formed, in a region where the π layer is not formed, on the first n-type compound semiconductor layer; and
a second electrode formed on the π layer.

16. The infrared light emitting device according to claim 15, wherein, on the semiconductor substrate, a plurality of infrared light emitting devices are sequentially formed so that the first electrode formed in any of the infrared light emitting devices and a second electrode formed in another infrared light emitting device adjacent to the infrared light emitting device having the first electrode formed therein are connected to each other in series.

17. The infrared light emitting device according to claim 2,
wherein the π layer has the same composition as the first n-type compound semiconductor layer, and
wherein the n-type wide band gap layer has a film thickness of a critical film thickness or less.

18. The infrared light emitting device according to claim 3,
wherein the π layer has the same composition as the first n-type compound semiconductor layer, and
wherein the n-type wide band gap layer has a film thickness of a critical film thickness or less.

19. The infrared light emitting device according to any of claims 4 to 6, 17, and 18, further comprising:
at least one first repeated layer and at least one second repeated layer between the first n-type compound semiconductor layer and the n-type wide band gap layer, the first repeated layer having the same composition as the first n-type compound semiconductor layer, the second repeated layer having the same composition as the n-type wide band gap layer,
wherein the first and second repeated layers are alternately disposed, and
a film thickness of the second repeated layer is a critical film thickness or less.

\* \* \* \* \*